INVENTOR
Richard L. Bickel

BY Stevens, Davis, Miller & Mosher
ATTORNEYS

INVENTOR
Richard L. Bickel
BY Stevens, Davis, Miller & Mosher
ATTORNEYS

INVENTOR
Richard L. Bickel
BY Stevens, Davis, Miller & Mosher
ATTORNEYS

INVENTOR
Richard L. Bickel

BY Stevens, Davis, Miller & Mosher
ATTORNEYS

United States Patent Office 3,031,628

Patented Apr. 24, 1962

3,031,628

TRANSISTOR OSCILLATOR

Richard L. Bickel, Dallas, Tex., assignor to Texas Instruments Incorporated, Dallas, Tex., a corporation of Delaware Filed Mar. 26, 1958, Ser. No. 724,003
10 Claims. (Cl. 331—113)

This invention relates to a transistor oscillator circuit which provides a plurality of voltage waveform outputs. The circuit generates square, triangular and sawtooth waveforms. Such a generator has a general utility and has a particular utility for automatic transistor and vacuum tube testing apparatus.

The circuit of the invention contains three transistors, two of which are connected in an emitter coupled flip-flop circuit. The third transistor is connected as a time delay determined by an R.C. time constant.

Prior to the present invention transistor flip-flop circuits and transistor oscillators having only one output waveform were known. The circuit according to the present invention improves on these prior art circuits by providing three different output waves, triangular, square, and sawtooth from a single oscillator. One of the advantages of the present circuit is that its switching time is not affected by the size of the R.C. circuit and therefore the rise times of the square wave and sawtooth wave outputs are independent of the oscillator frequency. Another advantage is that none of the output waveforms have any overshoot. The wave generator may be synchronized by means of an external pulse applied to the base of one of the switching transistors. Also, the circuit may be gated off and on by controlling the D.C. voltage on the base return resistors of one of the switching transistors.

The objects and advantages of this invention can be better understood from the following detailed description with reference to the drawings wherein:

FIGURE 1 illustrates the basic circuit of the invention using two germanium PNP transistors and one silicon NPN transistor;

FIGURE 1*a* illustrates the voltage waveforms as a function of time produced by the circuits of FIGURES 1, 2, 3 and 4;

Figure 5:
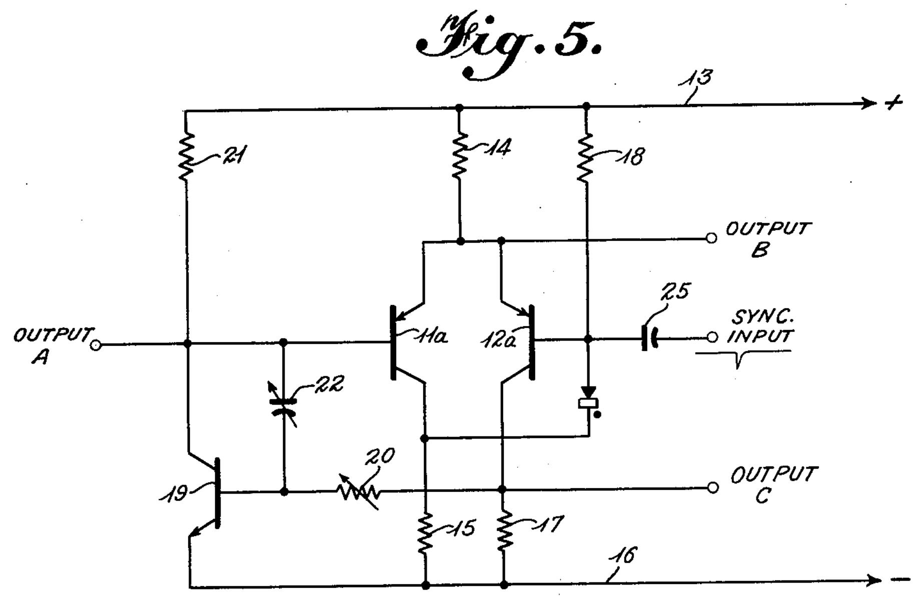
FIGURE 5 shows a modification of the basic circuit with a synchronization input.
Figure 5A:
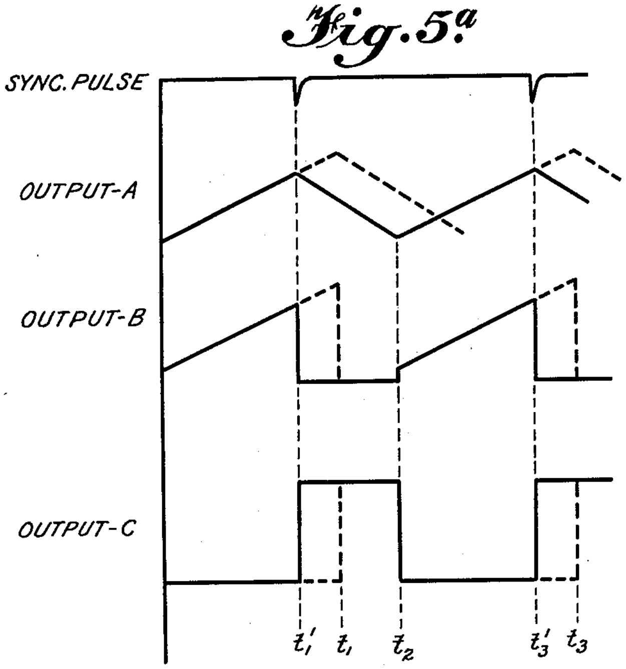
Figure 6:
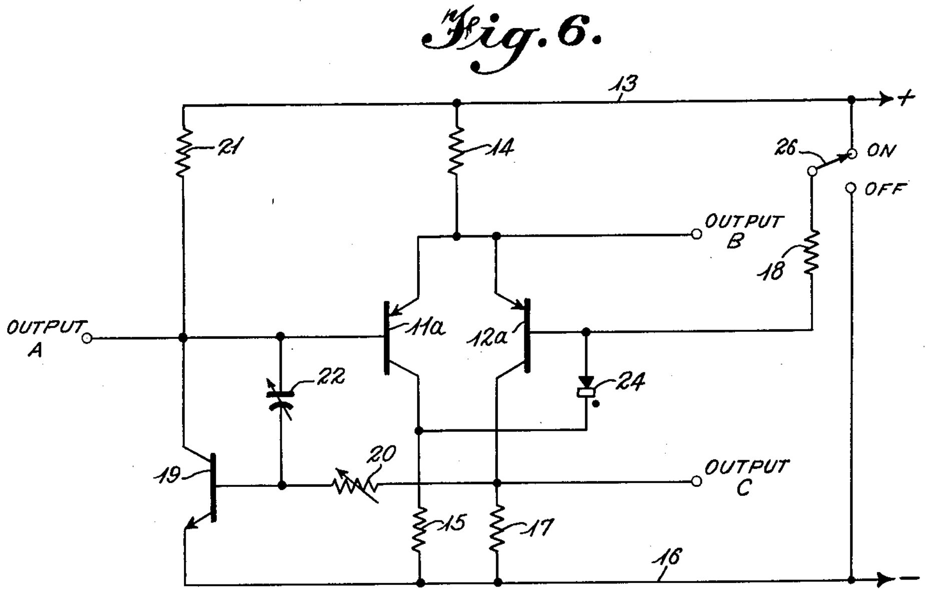
Figure 6A:
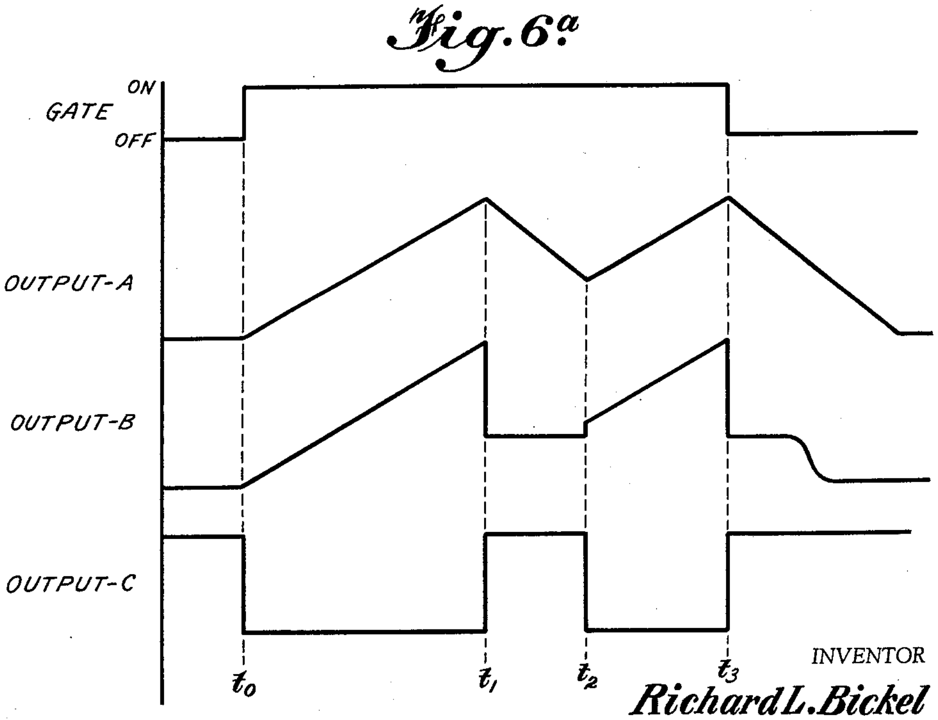

FIGURE 5*a* shows the voltage waveforms as a function of time produced by the circuit of FIGURE 5;

FIGURE 6 shows a modification of the basic circuit wherein the generator may be gated off and on; and FIGURE 6*a* represents the voltage waveforms produced by the circuit of FIGURE 6 plotted as a function of time.

Figure 1:
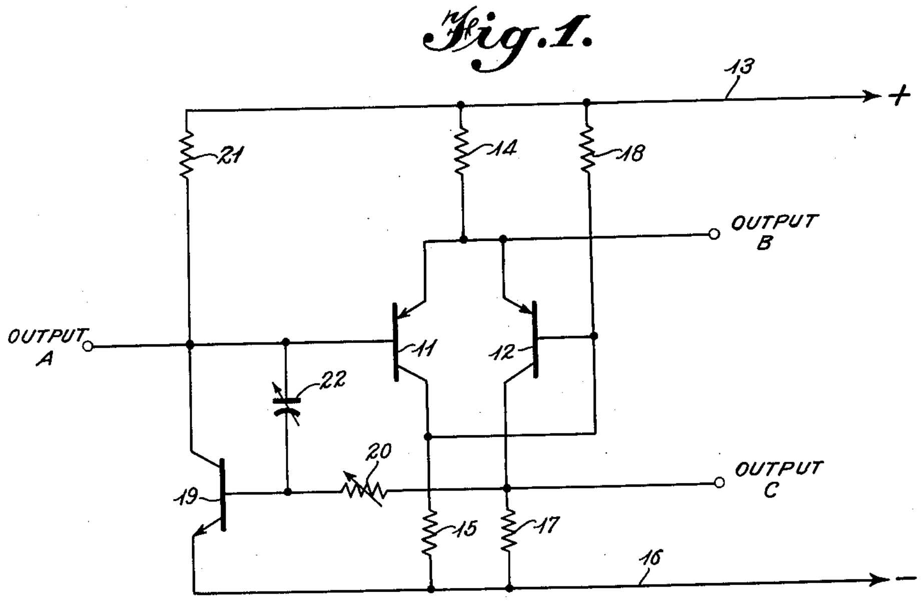

With reference to FIGURE 1, in which there is shown the basic circuit of the invention, a pair of PNP germanium transistors 11 and 12 have their emitters connected together and to a line 13 through a resistor 14. The positive side of a D.C. voltage supply is applied to line 13. The collector of transistor 11 is connected through resistor 15 to line 16, to which the negative side of the D.C. voltage supply is connected. The collector of transistor 12 is connected to this negative voltage on line 16 through a resistor 17. The collector of the transistor 11 is also connected to the base of the transistor 12, which base is connected to the positive voltage on line 13 through a resistor 18. The collector of the transistor 12 is connected to the base of an NPN silicon transistor 19 through a variable resistor 20. The emitter of the transistor 19 is connected to the negative voltage on line 16 and the collector to the positive voltage on line 13 through a resistor 21. The collector of the transistor 19 is also connected to the base of the transistor 11. A variable capacitor 22 connects the base of the transistor 11 to the base of the transistor 19. Three outputs, A, B, and C are taken from this circuit. The output A is taken from the collector of the transistor 19, the output B is taken from the emitters of the transistors 11 and 12, and the output C is connected to the collector of the transistor 12. The waveforms produced at the outputs A, B, and C are shown in FIGURE 1*a*.

The operation of the circuit will now be described. For a starting point let it be presumed that the transistor 12 has just been switched from a non-conducting state to a conducting state. This instant of time is indicated by the reference $t_1$ in FIGURE 1*a*. Because the transistor 12 has just been switched to a conducting state the current through the resistor 17 is suddenly increased and the voltage across this resistor undergoes a step increase. The voltage across resistor 17 is the output voltage at output C and is so designated in FIGURE 1*a*. This step increase in voltage causes current to start flowing from the collector of the transistor 12 through the variable resistor 20, and into the variable capacitor 22 and the base of transistor 19. This flow of current will start a gradual rise in the voltage applied to the base of the transistor 19. When the voltage of the base of the transistor 19 rises, the conductivity of this transistor increases, thus increasing the current flow through the transistor 19. Initially, the increased current flow through transistor 19 is supplied by the current flowing through variable capacitor 22 from variable resistor 20. The current flowing into capacitor 22 from the junction of capacitor 22 and resistor 20 subtracts from the base current of transistor 19 in such a way as to limit the increased conduction of transistor 10 to that required for the discharge of capacitor 22. Thus, the voltage at the collector of the transistor 19 will begin to fall due to the discharge of variable capacitor 22. The collector voltage of the transistor 19 is the same as output voltage A and is illustrated in FIGURE 1*a*. This lowering of output voltage A increases the voltage across resistor 21 which, in turn, supplies some of the increased current flowing through the transistor 19. Thus, it can be seen that the action of the capacitor 22 is three-fold in effecting a gradual drop of output voltage A. First, it receives current from the resistor 20 slowing the rise of the base voltage of the transistor 19, thus slowing the increased conductivity of this transistor. Second, it supplies some of the increased current flow through the transistor 19 thus lessening the drop in output voltage A. And third, it couples the decreasing voltage at the collector of transistor 19 back into the base of transistor 19 in such a manner as to regulate the rate of drop of the collector voltage of transistor 19.

Figure 1A:
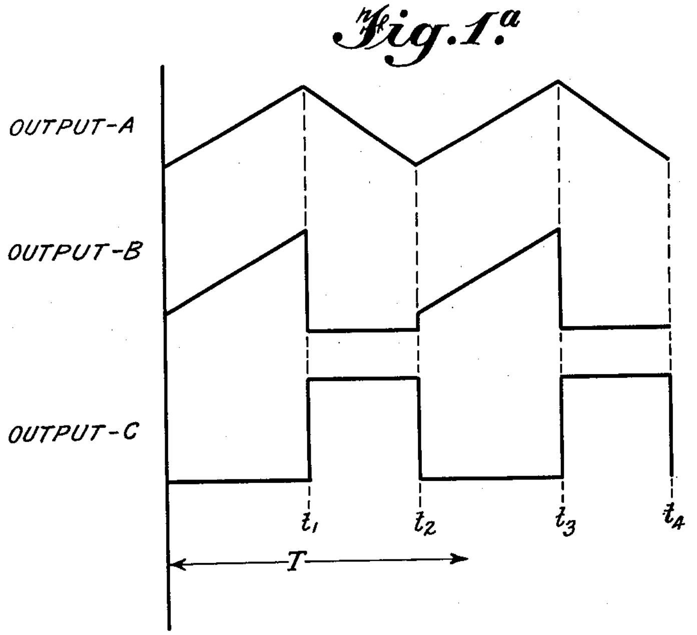

Over a short period of time, the drop of the output voltage A is almost linear as shown in FIGURE 1*a* after time $t_1$. This dropping voltage is applied to the base of transistor 11 which, at this time, is non-conducting because the emitter voltage of the transistor 11 is low as a result of the conduction of current through the transistor 12 and the base voltage of transistor 11 is high relative to this emitter voltage. The output voltage A applied to the base of the transistor 11 gradually decreases until it reaches a value low enough relative to the emitter voltage of transistor 11 that transistor 11 begins to conduct. The instant of time at which transistor 11 begins to conduct is designated as $t_2$ in FIGURE 1*a*. When the transistor 11 begins to conduct the voltage at its collector rises due to the increase of current flowing through the resistor 15. This rise in voltage is transmitted directly to the base of the transistor 12 and decreases the conductivity of this transistor causing a rise in the emitter voltage of this transistor. The emitter voltage of transistor 12 is the same as output B and is illustrated in FIGURE 1*a*. This rise in the output voltage B is transmitted to the emitter of transistor 11 further increasing the conduction of transistor 11. The effect is thus accumulative so that the transistor 12 is almost instantaneously switched to a non-conducting condition and the conduction through the transistor 11 instantaneously rises to a value determined by the voltage output A applied to the base of transistor 11 at time $t_2$. As a result of this switching action at time $t_2$, the output voltage C has a step decrease and the output voltage B has a small step increase. The output voltage B increases only a small amount because the cutting off of current flow through transistor 12 is partially compensated by the start of current flow in transistor 11. The step decrease in the output voltage C starts current to flow from the capacitor 22 through the resistor 20 starting a gradual decrease in the voltage applied to the base of transistor 19. This decrease in voltage results in a corresponding decrease in the conductivity of the transistor 19 and a decrease in current flowing through the transistor. As a result the current flow through resistor 21 starts to flow into capacitor 22 and the voltage at output A begins to rise. Part of the current from capacitor 22 flows through resistors 20 and 17 into line 16 and part into the base of transistor 19. The current flowing into the base of transistor 19 controls the rate of decrease of conduction of transistor 19. Thus, the effect of the capacitor 22 is likewise three-fold in causing output voltage A to increase gradually after the time $t_2$.

Over a short period of time the increase in output voltage A is almost linear as shown in FIGURE 1*a*. This gradual increase is applied to the base of the transistor 11. This transistor, which switched to a conducting state at time $t_2$, will, as a result of its rising base voltage, decrease in conductivity. This action will result in a decrease in current flow through resistor 14 and a gradual increase in the output voltage B as illustrated in FIGURE 1*a*. As the conductivity of the transistor 11 decreases, the current flow through resistor 15 will decrease. Therefore, the voltage at the collector of transistor 11 and hence at the base of transistor 12 will decrease so that the transistor 12 has an increasing voltage applied to its emitter and a decreasing voltage applied to its base. This action will continue until the voltage changes at the emitter and base of transistor 12 reach a point where the transistor 12 begins to conduct. This instant is designated as time $t_3$ in FIGURE 1*a*. When the transistor 12 begins to conduct its emitter voltage will decrease. This results in a drop of the emitter voltage of the transistor 11 which decreases the conductivity of the transistor 11. This decrease in conductivity of the transistor 11 will further increase the collector voltage of transistor 11, which is applied directly to the base of the transistor 12, thus further increasing the conductivity of transistor 12. The action is thus cumulative and the transistor 12 immediately is switched to a conducting state at time instant $t_3$ and results in a step increase in the current flowing in the resistor 17 and hence in output voltage C as shown in FIGURE 1*a*. Likewise, the cumulative switching action results in the transistor 11 being switched to a non-conducting state. The voltage output B undergoes a step decrease at time $t_3$ due to the switch of transistor 12 from a non-conducting to a conducting state. The switch of transistor 11 from conducting to non-conducting has little effect on the output voltage B because the conductivity of transistor 11 has already been greatly decreased prior to time $t_3$ by the raised voltage at the base of transistor 11. The operation of the circuit will then repeat itself as from time $t_1$. As a result voltage waveforms are produced at outputs A, B, and C, as shown in FIGURE 1*a*.

Figure 2:
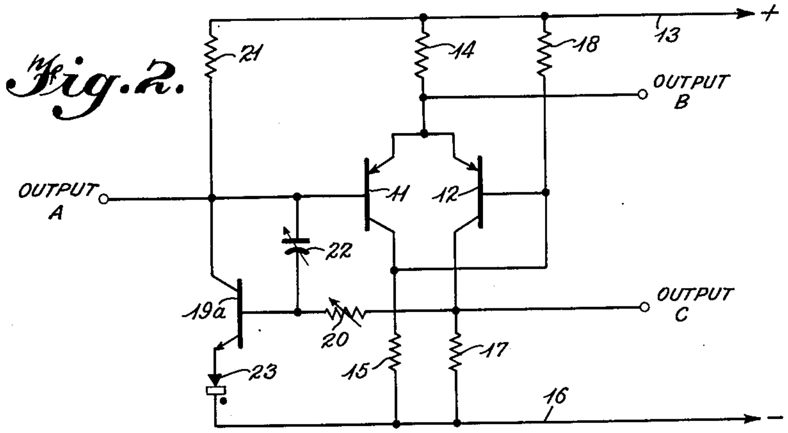
FIGURE 2 shows a modification of the basic circuit using all germanium transistors.

In the modification shown in FIGURE 2 a germanium NPN transistor 19*a* is used instead of the silicon transistor 19 of FIGURE 1; thus all three transistors are germanium. This circuit is the same as that of FIGURE 1, except that the emitter of the transistor 19*a* is connected to line 16 through a silicon diode 23 instead of directly, as in FIGURE 1. The anode of the diode 23 is connected to the emitter and the cathode of the diode is connected to line 16 so that current flows in the forward direction therethrough. This diode is placed in the circuit because a germanium transistor requires a lower base to emitter bias than does a silicon transistor. The forward voltage drop across the diode 23 is generally constant over a wide range. It raises the emitter voltage of the transistor 19*a* and thus decreases the base to emitter bias. It is possible to use a reverse connected low voltage reference diode for the same purpose by connecting the cathode of the diode to the emitter of transistor 19*a* and the anode of the diode to line 16. The output waveforms A, B, and C produced by the circuit of FIGURE 2 are the same as those shown in FIGURE 1*a*.

Figure 3:
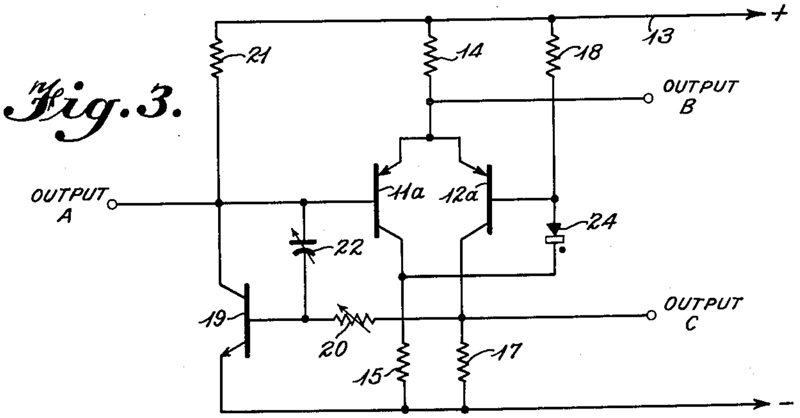
FIGURE 3 shows a modification of the basic circuit wherein compensation is provided for saturation voltage drop in one of the germanium transistors.

The circuit of FIGURE 3 is designed to compensate for high saturation resistance which may occur in some germanium transistors otherwise suitable for use as transistor 11. This circuit is connected exactly the same as a circuit shown in FIGURE 1 except that a silicon diode 24 replaces the direct connection between the collector of the transistor 11 in the base of the transistor 12. The diode has its cathode connected to the collector of transistor 11*a* and its anode connected to the base of transistor 12*a* so that current flows therethrough in the forward direction. When the transistor 11*a* starts to conduct such as at time $t_2$ it is operating at first in its saturated region. There will be some voltage drop across the transistor 11*a* at this time due to the saturation resistance of the transistor 11*a*. Because of this voltage drop the collector voltage of the transistor 11*a* may be insufficiently high to satisfactorily carry out the switching action whereby the transistor 12*a* is switched to a non-conducting condition and the transistor 11*a* is switched to a non-conducting condition. The diode 24 provides a relatively constant voltage drop between the base of the transistor 12*a* and the collector of the transistor 11*a*, thus compensating for the saturation voltage drop across the transistor 11*a*. For, although the collector voltage of the transistor 11 may be too low to satisfactorily carry out switching action, the base of the transistor 12*a* will be high enough because of the voltage drop across the diode 24. The voltage drop may be obtained by using a reverse connected reference diode with its cathode connected to the base of the transistor 12*a* and the anode connected to the collector of the transistor 11*a* particularly if the saturation voltage drop is large. The voltage drop across the diode should be larger than the saturation voltage drop across the transistor 11*a*. The waveforms produced at outputs A, B, and C of the circuit of FIGURE 3 are the same as those shown in FIGURE 1*a*.

Figure 4:
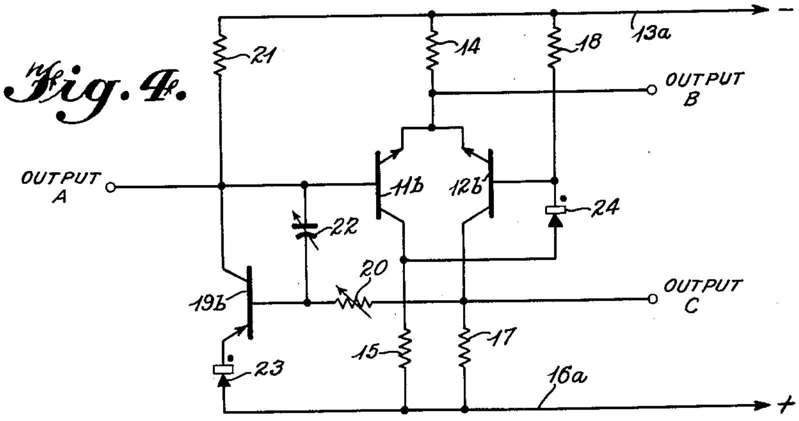
FIGURE 4 shows a modification of the basic circuit wherein NPN transistors are substituted for PNP transistors and vice versa.

The circuit of the invention may be modified by interchanging the PNP transistors with NPN transistors and the NPN with a PNP transistor. Such a circuit is shown in FIGURE 4. This circuit is connected similarly as the circuit shown in FIGURE 1. The polarity of the D.C. power supply is reversed with the positive side being applied to line 16*a* and the negative side applied to line 13*a*. The transistor 19*b* is chosen as germanium. Accordingly, the emitter of the transistor 19*b* is connected to the line 16*a* over a diode 23 to provide the correct emitter to base bias. Also, a diode 24 is provided to connect the collector of the transistor 11*b* to the base of the transistor 12*b* to compensate for saturation voltage drop. In order that the diodes 23 and 24 be connected in their forward direction it is necessary that the connections be reversed from that shown in FIGURES 2 and 3. That is, the diode 23 has its anode connected to the emitter of the transistor **19*b* and its cathode connected to line 16*a*, and the diode 24 has its anode connected to the base of the transistor 12*b* and its cathode connected to the collector of the transistor 11*b***. Of course, the diodes may be reverse connected reference diodes as was explained with reference to FIGURES 2 and 3. The waveforms produced by the circuit shown in FIGURE 4 will be the same as those shown in FIGURE 1*a* except that the polarity of the waveforms will be reversed.

The circuit of the oscillator can be adapted so that the output waveforms can be synchronized. Such a circuit is shown in FIGURE 5. This circuit is the same as the circuit shown in FIGURE 3 except that a synchronizing input is provided. The synchronizing input is connected to the base of the transistor **12*a* through a capacitor 25**. The waveforms produced by this circuit are shown in FIGURE 5*a*. In this figure the synchronizing pulses are applied at times $t_1'$ and $t_3'$. Before time $t_1'$ the transistor **11*a* is conducting and the transistor 12*a* is non-conducting. The output A applied to the base of transistor 11 is rising in the same manner as described with reference to the circuit in FIGURE 1. However, before this voltage rises far enough to cause the transistor 11*a* to initiate the switching action, the synchronizing pulse is applied at time $t_1'$. The pulse is applied from the synchronizing input over the capacitor 25 to the base in the transistor 12*a*. As a result, the transistor 12*a* will increase its conductivity thus causing a sudden drop in the emitter voltage of transistor 11*a* and thereby start the cumulative switching action whereby transistor 11*a* is switched to a non-conducting state and the transistor 12*a* is switched to a conducting state. This action is prior to the time that the automatic switching would occur. If the synchronizing pulse were not applied the output voltage A would rise until time $t_1$, when transistor 12*a*** would start conducting and the switching would occur automatically as illustrated in dotted lines in FIGURE 5*a* and as explained above with reference to FIGURES 1 and 1a. At time $t_2$ the circuit will again switch with the transistor **12*a* changing to a non-conducting state and the transistor 11*a*** changing to a conducting state by the automatic process as is described above with reference to FIGURES 1 and 1*a*. Again the output voltages A and B will start to rise from the time $t_2$ but the synchronizing pulse applied at the time $t_3'$ will initiate the switching action again to cause transistor **11*a* to switch to a non-conducting state and the transistor 12*a*** to switch to a conducting state prior to the time $t_3$ when the automatic switching would occur. Thus the circuit produces the waveforms shown in solid lines in FIGURE 5*a* in synchronism with the synchronization pulses.

FIGURE 6 shows a modification of the invention whereby the oscillator is combined with a gate, by means of which the oscillator can be turned on or off. This circuit is connected in the same manner as the circuit in FIGURE 3 except that the resistor 18 now connects the base of the transistor **12*a* to the double pole switch 26 instead of to line 13. The switch 26 can selectively connect the resistor 18 either to line 13 or to the negative side of the supply voltage on line 16. The position of this switch can mechanically gate the wave generator "on" or "off." When the switch is in position to connect the resistor 18 to the line 13 the generator is gated "on" when it is in position to connect the resistor 18 to the line 16 the generator is gated "off." The switch 26** is shown as manually operated but it may be operated by a relay or the switching may be done electronically. FIGURE 6*a* shows the waveforms which will be produced by the circuit of FIGURE 6. Prior to the time $t_0$ the switch 26 is in the "off" position and connects the resistor 18 to the line 16. As a result the negative voltage will be applied to the base of the transistor **12*a* biasing this transistor into a conducting state. Accordingly, a high current will flow through the resistor 17 and the output voltage C will be high. The high voltage applied from output C will be applied to the base of the transistor 19 causing this transistor to be in a conducting state. As a result, output voltage A will be low. Since the output voltage A is low the transistor 11*a* will also be conducting. The output voltage B will also be low because of the conduction through transistors 11*a* and 12*a*. The diode 24 prevents the collector voltage on transistor 11*a* from cutting off the conduction through transistor 12*a*. At time $t_0$ the switch 26 is switched from the "off" position to the "on" position. The transistor 12 will thereupon have applied to its base a high positive voltage over the resistor 18 from line 13. This will cause the transistor 12*a* to stop conducting and the output voltage C will correspondingly drop in a step to a low value. There is no corresponding appreciable rise in the output voltage B as the transistor 11 continues to conduct. The step decrease in voltage at output C will start current flowing through the resistor 20 and into the capacitor 22**, thus starting a rise in the output voltage A and a corresponding rise in output B in the same manner as was described with reference to FIGURES 1 and 1*a*. The circuit will continue to operate in the same manner as was described with reference to FIGURES 1 and 1*a* as long as the switch 26 remains in the "on" position. When at time $t_3$ the switch 26 is returned to the "off" position the circuit will return to equilibrium and the outputs A, B, and C will return to the values that they had prior to the time $t_0$. Thus, the wave generator can be switched on and off by the gating action of the switch 26.

The circuit of the invention as described above thus produces a plurality of output waveforms and can be synchronized or gated as desired. The modifications described above and other modifications are deemed to be within the spirit and scope of this invention, which is to be limited only as defined in the appended claims.

What is claimed is:

1. An oscillator circuit comprising a first conductor and a second conductor, means to apply a direct current voltage between said first and second conductors, first, second and third transistors, the emitters of said first and second transistors being connected together, resistive means for connecting the emitters of said first and second transistors to said first conductor, resistive means for connecting the collector of said first transistor to said second conductor, resistive means for connecting the collector of said second transistor to said second conductor, resistive means for connecting the base of said second transistor to said first conductor, conductive means for connecting the collector of said first transistor to the base of said second transistor, resistive means for connecting the collector of said third transistor to said first conductor, conductive means for connecting the emitter of said third transistor to said second conductor, resistive means for connecting the collector of said second transistor to the base of said third transistor, capacitive means for connecting the base of said third transistor to the collector of said third transistor, and conductive means for connecting the collector of said third transistor to the base of said first transistor.

2. An oscillator circuit as recited in claim 1 wherein said resistive means for connecting the base of said second transistor to said first conductor includes a switching means for selectively connecting either to said first conductor or to said second conductor.

3. An oscillator circuit comprising a D.C. potential supply, a first transistor, a second transistor, common resistive means coupling the emitters of said first and second transistors to one side of the D.C. potential supply, resistive means coupling the base of said second transistor to said one side of the D.C. potential supply, first means to couple the collector of said first transistor to the opposite side of the D.C. potential supply, second means to couple the collector of said second transistor to said opposite side of the D.C. potential supply, third means to couple the collector output of said first transistor to the base of said second transistor, and fourth means coupling the collector of said second transistor to the base of said first transistor to place said first transistor in a state of gradually linearly decreasing conduction when said second transistor is rendered non-conductive and to apply a gradually linearly decreasing voltage to the base of said first transistor when said second transistor is rendered conductive to cause said first transistor to begin conducting a preselected time after said second transistor is rendered conductive, said fourth means comprising a third transistor having its collector connected to the base of said first transistor, resistive means connected between the base of said third transistor and the collector of said second transistor, capacitive means connected between the base and the collector of said third transistor, resistive means connecting the collector of said third transistor to said one side of the D.C. supply, conductive means connecting the emitter of said third transistor to said opposite side of the D.C. potential supply.

4. An oscillator circuit as recited in claim 3 having output means connected to the emitters of said first and second transistors, output means connected to the collector of said second transistor and output means connected to the base of said first transistor.

5. An oscillator as recited in claim 3 wherein said first and second transistors are made of germanium semi-conductor material and said third transistors are made of silicon semiconductor material.

6. An oscillator circuit as recited in claim 3 wherein said third means includes a diode coupling the collector output of said first transistor to the base of said second transistor.

7. An oscillator circuit as recited in claim 3 wherein said first, second and third transistors are made of germanium semiconductor material and wherein said conductive means connecting the emitter of said third transistor to said opposite side of the D.C. potential supply comprises a diode.

8. An oscillator circuit as recited in claim 7 wherein said third means includes a diode coupling the collector output of said first transistor to the base of said second transistor.

9. An oscillator circuit as recited in claim 3 wherein said second transistor has a sync pulse input means coupled to the base thereof.

10. An oscillator circuit as recited in claim 3 wherein said resistive means coupling the base of said second transistor to said one side of the D.C. potential supply comprises means to gate said oscillator circuit into oscillation.

References Cited in the file of this patent

UNITED STATES PATENTS

| | | |
|---|---|---|
| 2,555,837 | Williams | June 5, 1951 |
| 2,594,104 | Washburn | Apr. 22, 1952 |
| 2,605,306 | Eberhard | July 29, 1952 |
| 2,662,178 | Levell | Dec. 8, 1953 |
| 2,726,331 | Robinson | Dec. 6, 1955 |
| 2,787,727 | Maure et al. | Apr. 2, 1957 |
| 2,827,574 | Schneider | Mar. 18, 1958 |
| 2,831,127 | Braicks | Apr. 15, 1958 |
| 2,845,548 | Silliman et al. | July 29, 1958 |
| 2,850,631 | Tillman | Sept. 2, 1958 |
| 2,854,575 | Richardson | Sept. 30, 1959 |
| 2,881,318 | Hughes et al. | Apr. 7, 1959 |
| 2,897,453 | Mansford | July 28, 1959 |
| 2,957,090 | Hamilton | Oct. 18, 1960 |